(12) United States Patent
Odom et al.

(10) Patent No.: US 8,048,789 B2
(45) Date of Patent: Nov. 1, 2011

(54) MESOSCALE PYRAMIDS, ARRAYS AND METHODS OF PREPARATION

(75) Inventors: Teri W. Odom, Chicago, IL (US); Joel Henzie, Evanston, IL (US); Eun-Soo Kwak, San Jose, CA (US)

(73) Assignee: Northwestern University, Evanston, IL (US)

(*) Notice: Subject to any disclaimer, the term of this patent is extended or adjusted under 35 U.S.C. 154(b) by 363 days.

(21) Appl. No.: 11/411,594

(22) Filed: Apr. 26, 2006

(65) Prior Publication Data

US 2007/0111366 A1     May 17, 2007

Related U.S. Application Data

(60) Provisional application No. 60/674,786, filed on Apr. 26, 2005.

(51) Int. Cl.
*H01L 21/28* (2006.01)

(52) U.S. Cl. . 438/576; 438/577; 438/670; 257/E21.025; 257/E21.034

(58) Field of Classification Search .......... 438/492–951; 257/E21.025, E21.034, E21.038, E21.235, 257/E21.587
See application file for complete search history.

(56) References Cited

U.S. PATENT DOCUMENTS

| | | | | |
|---|---|---|---|---|
| 4,116,720 A | * | 9/1978 | Vinson | 438/239 |
| 5,328,559 A | * | 7/1994 | Jerman | 216/84 |
| 5,866,438 A | * | 2/1999 | Itoh et al. | 438/20 |
| 5,980,119 A | * | 11/1999 | Furuyama | 385/89 |
| 5,994,160 A | * | 11/1999 | Niedermann et al. | 438/53 |
| 6,127,623 A | * | 10/2000 | Nakamura et al. | 136/256 |
| 6,586,327 B2 | * | 7/2003 | Shepard | 438/626 |
| 6,781,224 B2 | * | 8/2004 | Yoneda et al. | 257/686 |
| 7,311,981 B2 | * | 12/2007 | Saint Ramond et al. | 428/632 |

OTHER PUBLICATIONS

Qiaobing Xu Fabrication of Free-Standing Metallic Pyramidal Shells), Nano Letters 2004 vol. 4, No. 12, pp. 2509-2511 (Published Nov. 12, 2004).*
Grupp, DE; Lezec, HJ; Thio, T; and Ebbesen, TW; Beyond the Bethe Limit: Tunable Enhanced Light Transmission Through a Single Sub-Wavelength Aperture; Advanced Materials, 1999, 860-862, 11 (10).
Yin, L; Vlasko-Vlasov, VK; Rydh, A; Pearson, J; Welp, U; Chang, SH; Gray, SK; Schatz, GC; Brown, DB; and Kimball, CW; Surface plasmons at single nanoholes in Au films; Applied Physics Letters, Jul. 19, 2004, 467-469, 85 (3).
Greyson, EC; Babayan, Y; and Odom, TW; Directed Growth of Ordered Arrays of Small-Diameter ZnO Nanowires; Advanced Materials, Aug. 4, 2004; 1348-1352, 16 (15).
Odom, TW; Thalladi, VR; Love, JC and Whitesides, GM; Generation of 30-50 nm Structures Using Easily Fabricated, Composite PDMS Masks, J. Am. Chem. Soc., Sep. 21, 2002, 12112-12113, 124 (41).
Odom, TW; Love, JC; Wolfe, DB; Paul, KE and Whitesides, GM; Improved Pattern Transfer in Soft Lithography Using Composite Stamps; Langmuir, Jun. 25, 2002, 5314-5320, 18 (13).
Liu, B and Zeng, HC; Room Temperature Solution Synthesis of Monodispersed Single-Crystalline ZnO Nanorods and Derived Hierarchical Nanostructures; Langmuir, May 11, 2004, 4196-4204, 20 (10).
Love, JC; Gates, BD: Wolfe, DB; Paul KE; and Whitesides, GM; Fabrication and Wetting Properties of Metallic Half-Shells with Submicron Diameters; Nano Letters, 2002, 891-894, 2 (8).

(Continued)

*Primary Examiner* — Khiem D Nguyen
(74) *Attorney, Agent, or Firm* — Reinhart Boerner Van Deuren s.c.

(57) ABSTRACT

Ordered, two-dimensional arrays of pyramidal particulates and related methods of preparation.

13 Claims, 9 Drawing Sheets

OTHER PUBLICATIONS

Xu, Q; Tonics, I; Fuerstman, MJ; Love, JC; and Whitesides, GM; Fabrication of Free-Standing Metallic Pyramidal Shells; 2004, 2509-2511, 4 (12).

Chang, SH; Gray, SK; and Schatz, GC; Surface Plasmon Generation and Light Transmission by Isolated Nanoholes and Arrays of Nanoholes in Thin Metal Films; Optics Express, Apr. 18, 2005, 3150-3165, 13 (8).

Hecht, B; Bielefeldt, H; Novotny, L; Inouye, Y; and Pohl, DW; Local Excitation, Scattering, and Interference of Surface Plasmons; Physical Review Letters, Aug. 26, 1996, 1889-1892, 77 (9).

Koerkamp, KJK; Enoch, S; Segerink, FB; Van Hulst, NF; and Kuipers, L; Strong Influence of Hole Shape on Extraordinary Transmission through Periodic Arrays of Subwavelength Holes; Physical Review Letters; May 7, 2004, 183901-1-183901-4, 92 (18).

Jin, R; Cao YW; Mirkin, CA; Kelly, KL; Schatz, GC; and Zheng, JG; Photoinduced Conversion of Silver Nanospheres to Nanoprisms; Science, Nov. 30, 2001, 1901-1903, 294.

Prodan, E; Radloff, C; Halas, NJ; and Nordlander, P; A Hybridization Model for the Plasmon Response of Complex Nanostructures; Science, Oct. 17, 2003, 419-422, vol. 302.

Childs, WR and Nuzzo, RG; Large-Area Patterning of Coinage-Metal Thin Films Using Decal Transfer Lithography, Langmuir, 2005, 195-202, 21 (1).

Lu, Y; Liu, GL; Kim, J; MEJIA, YX; and Lee, LP; Nanophotonic Cresent Moon Structures with Sharp Edge for Ultrasensitive Biomolecular Detection by Local Electromagnetic Field Enhancement Effect; Nano Letters, 2005, 119-124, 5 (1).

* cited by examiner

Figure 2A
Figure 2B
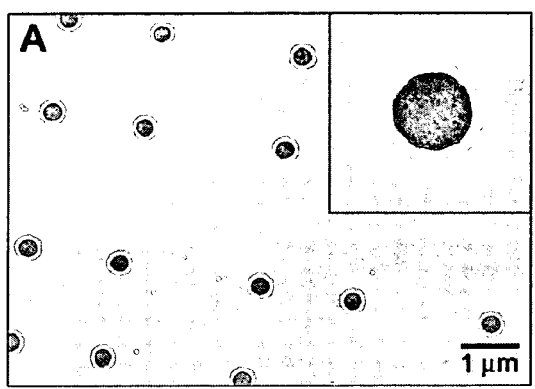
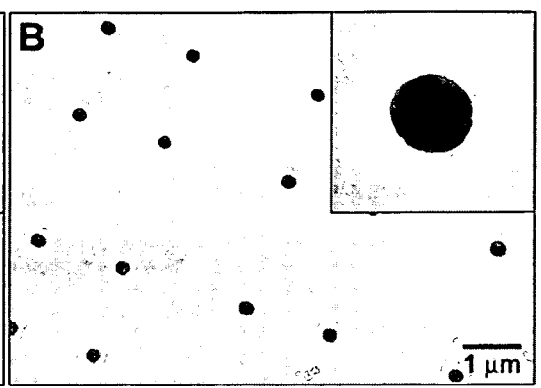
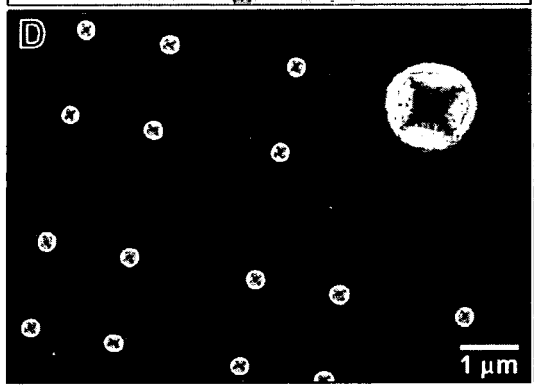
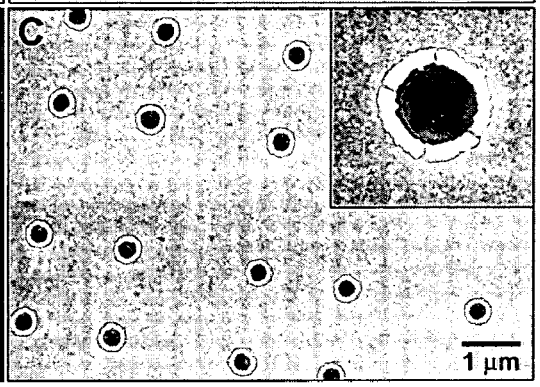
Figure 2D
Figure 2C

Figure 6A       Figure 6B
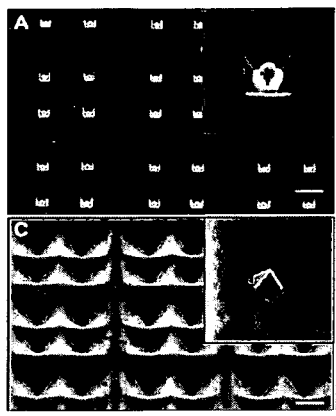 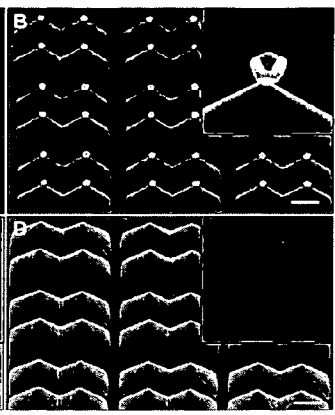 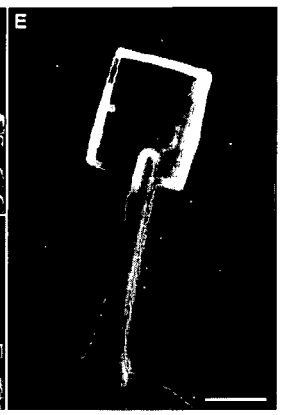
Figure 6E
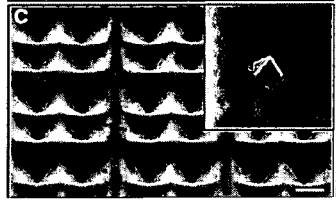 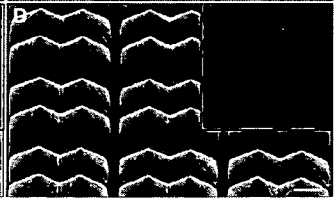
Figure 6C       Figure 6D

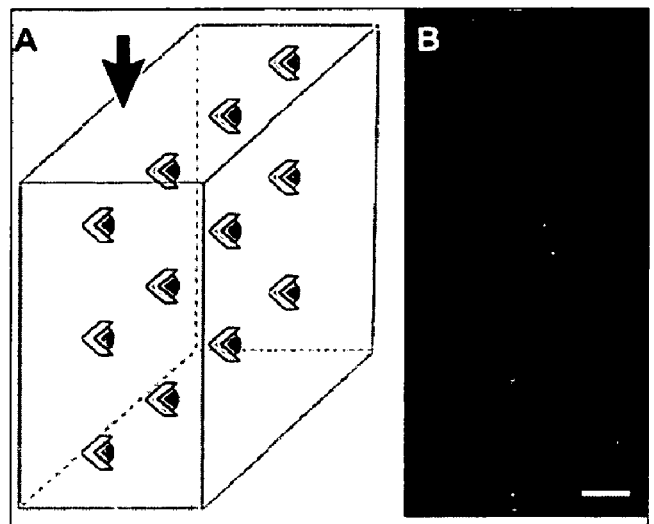
Figure 8A
Figure 8B
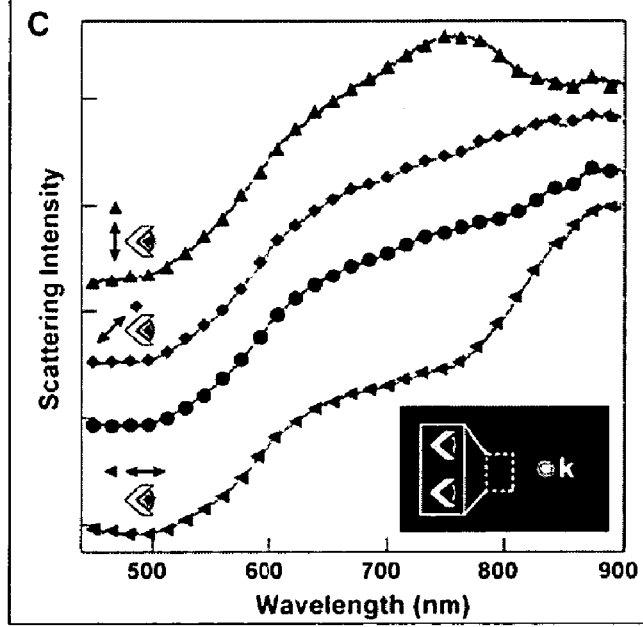
Figure 8C

MESOSCALE PYRAMIDS, ARRAYS AND METHODS OF PREPARATION

This application claims priority benefit from provisional application Ser. No. 60/674,786, filed Apr. 26, 2005, the entirety of which is incorporated herein by reference.

The United States government has certain rights to this invention pursuant to Grant No. NCC2-1363 from the National Aeronautics and Space Administration to Northwestern University.

BACKGROUND OF THE INVENTION

The optical properties of metallic nanoparticles are interesting because of their fundamental science and potential for emerging applications. For example, their broad optical tunability from ultraviolet to near-infrared wavelengths can be exploited in nanoscale photonics, chemical and biological sensing, and high-efficiency photovoltaic devices. Electromagnetic radiation can interact with metallic nanoparticles through the resonant excitation of their surface free electrons. These collective electron density oscillations, confined to a finite volume, are known as localized surface plasmons (LSPs) and are sensitive to the size, shape and dielectric environment of the nanoparticle.

Both solution-based syntheses and fabrication techniques have been used to generate metallic particles. Most research efforts have focused on the chemical synthesis of nanoparticles because the preparative techniques are relatively straightforward; the size and shape of nanoparticles can be tailored by controlling conditions such as reaction temperature, surfactants, and concentrations of precursors. Spherical particles with sizes less than 50 nm support single LSP resonances that are dipolar in character. Accordingly, their optical properties can be explained reasonably well by the lowest order term in Mie theory. In contrast, larger metallic particles (diameters>100 nm) with anisotropic shapes can exhibit multiple LSP resonances that correspond to higher order modes. Disordered assemblies of 100-nm Ag particles imbedded in poly(dimethylsiloxane) (PDMS) films showed a dipole resonance as well as a quadrupole resonance as the film was stretched in two-dimensions. Solution-phase synthesis often provides a flexible route to size and shape control of metallic nanoparticles, which can in turn provide tuning and control of their respective optical properties. However, a common drawback of such solution-based preparations, especially with regard to synthesis of noble metal nanoparticles, is the formation of various other shapes in addition to the desired particulate configuration.

Sacrificial templates have been employed in the art for molding the size and shape of free-standing nano- and mesostructures. Typically, solid and supported structures, such as nm-sized pores in anodized alumina membranes or μm-sized etched pits in silicon are used. Electro-deposition of conducting materials or molding of polymers reproduces the shape and structure of the template; the templates are then removed by the appropriate etchants. Free-standing structures such as metallic (and multi-layered) rods, pyramidal tips for scanning probe applications, and μm-sized metallic pyramidal shells have been produced. The μm-sized pyramidal shells, for instance, were found to exhibit tips with radius of curvature r as small as 50 nm. Other types of templates, including silica spheres, have recently been used to fabricate metallic structures with unusual shapes. Such structures were generated by e-beam deposition of metal onto silica spheres followed by etching of the sphere-template. Sub-micron "half-shells" made from different metals as well as "crescent moon" structures with sharp edges in silver were also produced. The edges of these silver shell-structures enhanced the local electromagnetic field, and the Raman scattering of Rhodamine 6G from isolated, individual crescent moon structures could be detected.

Investigations of sub-micron particles have only recently been possible through improved chemical methods and fabrication techniques to generate particles with uniform size and shape. Although multipolar LSP resonances have been seen in the extinction spectra of sub-micron particles, the random dispersion of the particles in solution ensured that all resonant plasmon modes were measured simultaneously, and some peaks were obscured because of polarization averaging. Multipolar excitations can, however, depend on the direction of the propagation wavevector and polarization vector; thus, certain excitation angles can make selected resonances more pronounced. To correlate the orientation of the particles with specific plasmon modes directly, strategies that can both isolate particles and control their orientation are essential. Drop-coating or spin-casting dilute colloidal solutions onto glass slides have resulted in isolated particles although their orientation on the substrate was not well-defined, and the optical properties could only be related to particle shape in a non-uniform dielectric environment. Electron-beam lithography can create individual particles with a controlled orientation, although the shapes are limited to two-dimensional planar structures.

SUMMARY OF THE INVENTION

In light of the foregoing, it is an object of the present invention to provide metallic pyramidal particulates, arrays and method(s) for their preparation and/or assembly, thereby overcoming various deficiencies and shortcomings of the prior art, including those outlined above. It will be understood by those skilled in the art that one or more aspects of this invention can meet certain objectives, while one or more other aspects can meet certain other objectives. Each objective may not apply equally, in all its respects, to every aspect of this invention. As such, the following objects can be viewed in the alternative with respect to any one aspect of this invention.

It can be an object of the present invention to provide a method of preparing nanodimensioned pyramidal particulates with control over shape and size.

It can be another object of the present invention, alone or in conjunction with the preceding, to provide one or more methods for preparation of particulates free-standing or having a fixed orientation, depending on end-use application or subsequent characterization.

It can be another object of the present invention, with regard to a fixed orientation, to provide a method to coordinate controlled preparation with fabrication of a two-dimensional array of such nanodimensioned particulates, to preserve orientation, alignment and order.

It can be another object of the present dimension to provide a composite comprising such an array, which can be manipulated, by hand, to facilitate full characterization of the optical properties of such particles.

Other objects, features, benefits and advantages of the present invention will be apparent from this summary and the following description of certain embodiments, and will be readily apparent to those skilled in the art having knowledge of anisotropic nanoparticle shapes and configurations, fabrication and related plasmon resonance modes. Such objects, features, benefits and advantages will be apparent from the above as taken into conjunction with the accompanying examples, data, figures and all reasonable inferences to be drawn therefrom, alone or with consideration of the references incorporated herein.

In part, this invention can be directed to a method of preparing a pyramidal particulate. Such a method can comprise providing a substrate and a mask thereon, with the mask comprising at least one aperture therethrough; anisotropically treating the substrate through the aperture and under the mask to provide a pyramidal recess in the substrate; and depositing a layer of a first material component on the recess surface, to provide a pyramidal particulate therein. Such a method can comprise use of an Si(100) substrate, anisotropic treatment of which can provide single crystalline Si(111) facets. In conjunction with a mask of the sort illustrated below, metallic and other material components can be deposited thereon, using techniques described herein, to provide a particulate comprising a pyramidal shell configuration, removable from the substrate recess.

Choice of material component is limited only by use in conjunction with a particular deposition technique, providing desired rate and control of material placement. Without limitation, electron beam deposition techniques known in the art can be used with good effect to deposit a variety of metallic and/or magnetic materials, as well as other materials such as silicon and silicon oxide—through the mask and onto a recess surface. Such materials include but are not limited to gold, nickel, silver and combinations thereof. With regard to the latter, sequential deposition of one or more additional material components can provide particulates having a corresponding layered pyramidal shell configuration. Regardless, the first material component, upon substrate removal, can be functionalized or compositionally modified for further chemistry or subsequent use, employing synthetic techniques well known to those skilled in the art.

Such particulates can be dimensionally-controlled by variation of mask aperture dimension. In certain embodiments, such an aperture can be about 100 nm or less. In certain embodiments, aperture diameter can be about 250 nm or greater. Variations thereof between such parameters, together with time and rate of material deposition, can be used to control layer thickness and basal dimensions of the resulting pyramidal shells. Regardless, depending upon a particular fabrication technique, a mask can comprise a plurality of apertures, whether random or ordered, for mass production of such particulates. In certain embodiments, again depending on mask configuration, a substantially two-dimensional array of apertures can be used to provide a corresponding array of pyramidal recesses in the substrate, for material deposition.

If not removed from the substrate, an array of such pyramidal particulates can function as a mask for further fabrication. In such embodiments, the substrate can be anisotropically treated to remove the substrate from around the particulates, providing them positioned on the substrate at or about the pyramidal tips. Contacting the particulates with a resinous matrix material can be used to remove them from the substrate surface. In certain embodiments, such a material can be optically transparent and/or functionally dielectric, such that a well-ordered two dimensional array of particles positioned therein, with substantially uniform orientation and alignment, can be used for characterization of orientation-dependant optical properties of such particulates.

Accordingly, various methods of this invention can comprise one or more microscopic and/or spectroscopic analyses of such pyramidal particulates, such analyses as can be facilitated by preservation of a fabricated two-dimensional array of such particulates. Such an array can be then oriented about (e.g., parallel or perpendicular to) an axis of irradiation in conjunction with such an analysis. Such irradiation as can be polarizable and varied by wavelength. Such methods can be used to correlate orientation of the pyramidal particulates with illumination wave vector and/or polarization vector. Various other analytic techniques and end-use applications of such pyramidal particulates and/or arrays will be known to and understood by those skilled in the art made aware of this invention.

Accordingly, the present invention can also be directed to a composite comprising a dielectric component and a two-dimensional substantially planar array of metallic pyramidal components. As described above, such components can be uniformly oriented within the dielectric component, for further optional use or analysis. Such components can comprise one or more materials of the sort described elsewhere herein. Material choice is limited only by deposition technique in conjunction with the present method(s) and/or the utility of the resulting anisotropic configuration and related plasmon resonance modes. Regardless, in certain embodiments, such pyramidal components can comprise a noble metal or multiple layers of a combination of such metallic materials.

Without limitation as to material choice or composition, each layer of such a pyramidal component can comprise a variable thickness dimension, depending upon rate and time of deposition. In certain embodiments, without limitation, such a thickness dimension can range from about 10 nm to about 50 nm or more. Regardless, depending upon substrate recess volume, mask aperture diameter and other fabrication parameters of the sort described herein, the resulting pyramidal components can comprise a basal dimension up to about 300 nm, and/or can have a tip radius of curvature ranging from less than about 2 nm to about 15 nm. In certain embodiments, depending upon subsequent end-use application or analyses, such pyramidal particulates can comprise a basal dimension ranging from about 100 nm to about 250 nm, and/or can have a tip radius of curvature less than about 10 nm.

Depending upon dimension of the dielectric component and one or more of the aforementioned fabrication techniques, such a composite can comprise up to about $10^9$ or more pyramidal particulates per square inch of dielectric component, such a value depending at least in part on pyramidal dimension. Regardless, the dielectric component can have a dimension limited only by composite fabrication and a thickness dimension convenient for subsequent use or analysis. Typically, without limitation, such a dielectric component can comprise a film up to about 15 microns thick. PDMS is one non-limiting material as can be used as a dielectric component. Composites of this invention can comprise various other materials, optically-transparent and/or providing dielectric function, as would be known to those skilled in the art made aware of the present invention.

Accordingly, this invention can also be directed to method of fabricating a two-dimensional array of pyramidal metallic particulates. Such a method can comprise providing a substrate and a mask thereon, with the mask comprising a plurality of apertures therethrough; treating the substrate through the apertures and under the mask with an anisotropic etchant, to provide a plurality of pyramidal recesses in the substrate; depositing at least one metallic component on the pyramidal recess surfaces, with deposition at a rate and/or for a time sufficient to provide a layer of the metallic component(s) thereon; treating the substrate with an anisotropic etchant, to provide a substrate configuration supporting a two-dimensional array of the resulting pyramidal metallic particulates at about the tips thereof; and at least partially incorporating such particulates within a planar dielectric material.

As discussed above, electron beam deposition techniques known in the art can be used herewith. Depending upon control of one or more deposition parameters, a metallic component can be deposited on a surface area less than the total surface area of a substrate recess. For instance, in certain embodiments, notwithstanding recess dimension, deposition control can provide a pyramidal configuration adjustably dimensioned smaller than the corresponding recess. Regardless, a combination of metallic components can be sequentially deposited, each such deposition controlled to provide variable component-by-component layer thickness.

As illustrated below, the resulting two-dimensional array can be incorporated into a dielectric, optically transparent component and used to characterize orientation dependent optical properties of the incorporated metallic particulates. Alignment of the array with or at an angle to an axis of irradiation can be used to facilitate various microscopic and spectroscopic analyses. Polarizable and/or wavelength variable irradiation can be used as described herein to correlate orientation of the pyramidal metallic particulates with illumination wave vectors and/or polarization vectors, as can be used to further understand a relationship(s) between the three-dimensional configuration of such particles and their plasmon resonance modes.

BRIEF DESCRIPTION OF THE DRAWINGS

FIGS. 2A-D. Field emission scanning electron microscope (FESEM) images of the key fabrication steps. Clockwise from top left: (A) Cr-mask of 250-nm holes formed by PSP, e-beam deposition, and lift-off. (B) Etched Si(100) pyramidal pits undercutting the Cr-mask in (A). (C) 50-nm film of Ni deposited on (B). (D) Ni pyramids situated in the centers of the etched Si pits after removing the Cr-mask. The dimensions of all the insets are 500 nm×500 nm.

FIG. 6A-E. Scanning electron microscope (SEM) images of the key manipulation steps. (A) 250-nm diameter Au pyramids situated in the centers of etched Si pits spaced by ~2 µm. (B) Etched Si(100) pedestals supporting the Au pyramids. (C) Au pyramids transferred and partially imbedded within the PDMS film. White lines highlight the pyramidal tip. (D) Etched Si(100) pedestals after removal of the pyramids. The dimensions of all insets are 1 µm×1 µm, and scale bars are 1 µm. (E) Image of a 1-cm$^2$ pyramid array encapsulated in a thin PDMS film. Scale bar is 1 cm.

FIGS. 8A-C. Optical characterizations, as described herein, of Au pyramids in an array whose plane is parallel, (tips perpendicular) to the optical axis of the microscope.

DETAILED DESCRIPTION OF CERTAIN EMBODIMENTS

Various embodiments of this invention can comprise fabricating free-standing, monodisperse, metallic pyramids from different metals with variable thicknesses. The overall size of these pyramids can be mesoscale (e.g., ranging from about 100-about 300 nm) while their tips can be nanoscale (e.g., ranging from about 1-about 10 nm). Such metallic pyramids can be prepared, for instance, using a combination of phase-shifting photolithography (PSP), wet-chemical etching, and electron (e)-beam deposition. A patterning step can include the use of sub-250 nm holes in a chromium film as both an etch mask and as a deposition mask. In addition, such a methodology can generate multi-layered, pyramidal structures by taking advantage of the layer-by-layer capabilities of e-beam deposition. Such a top-down nanofabrication method can produce anisotropic structures that are monodisperse, highly uniform in shape and size, and multi-functional.

Several other embodiments of this invention can relate to characterization of the orientation-dependent optical properties of two-dimensional arrays of such anisotropic metallic nanoparticles. Such studies are facilitated by methods to encapsulate and manipulate aligned particles with complex three (3D)-dimensional shapes inside a uniform dielectric environment. Using dark field or scattering spectroscopy, the plasmon resonances of, for instance, 250-nm Au pyramidal shells imbedded in a PDMS matrix were investigated. It has been shown that scattering spectra of these particle arrays depend sensitively on the direction and polarization of the incident white light relative to the orientation of the pyramidal shells. Accordingly, this invention presents an approach to manipulate—by hand—ordered arrays of particles over cm$^2$-areas and permits new insight into the relationship between the shape of 3D-particles and their supported plasmon resonance modes.

Figure 1:
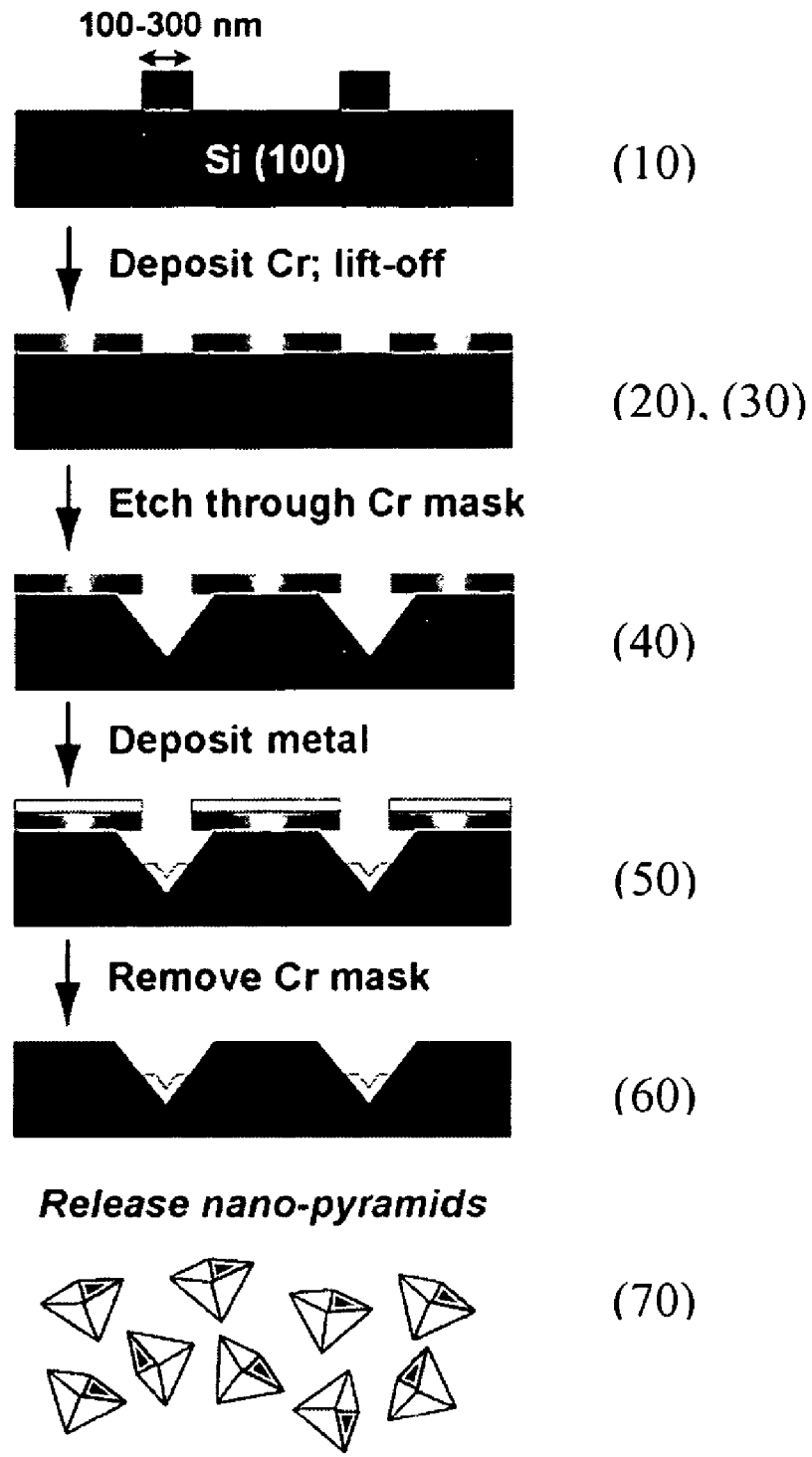
FIG. 1. Scheme depicting the fabrication of the free-standing metallic pyramids.

FIG. 1 (together with several subsequent figures) outlines a non-limiting procedure for generating metallic pyramids within the etched pits of a Si(100) substrate, using a Cr-film patterned with sub-250 nm holes as both the etch mask and deposition mask. First, an array (covering ~1 in.$^2$) of photoresist posts (typical diameters ~250 nm; smallest diameters ~100 nm) was patterned (10) on a Si(100) wafer using PSP. In brief, these posts were formed by exposing photoresist (Shipley 1805) through a h-PDMS mask patterned with a square array of dots and removing the exposed resist with 351 Microposit developer. A mask (e.g., 20 nm of Cr) was deposited (20) by e-beam on these photoresist posts, and lift-off (30) of the resist was achieved by sonicating the pattern in acetone. Round holes, with very smooth edges, were formed in the Cr-film (FIG. 2A). See, e.g., E. C. Greyson, Y. Babayan, T. W. Odom, *Adv. Mater.* 2004, 16, 1348-1352; T. W. Odom, J. C. Love, D. B. Wolfe, K. E. Paul, G. M. Whitesides, *Langmuir* 2002, 18, 5314-5320; and T. W. Odom, J. C. Love, V. R. Thalladi, G. M. Whitesides, *J. Am. Chem. Soc.* 2002, 124, 12211-12212, each of which is incorporated by reference in its entirety. Other methods known in the art can also be used with good effect, such methods including e-beam lithography and nanoimprint lithography. Likewise, materials other than Cr (e.g., Ti) can be used for a mask, as would be understood in the art.

Anisotropically etching (140) the exposed silicon with a KOH/isopropyl alcohol (IPA) solution formed pyramidal pits underneath the Cr-nanoholes (FIG. 2B). Undercutting the Cr film provided pyramids smaller than the size of the template of the pyramidal pits. Smoothness and symmetry of the Cr-etch mask can be useful in forming symmetrical pyramidal pits: for instance, oblate or rough Cr-holes produced oblate and/or irregularly shaped pyramids. The Cr-mask was also employed as a mask for deposition (50), and a 50-nm Ni film (e.g., 1-4 Å/s) was evaporated onto these patterns (FIG. 2C). The patterned samples were placed in the evaporator so that they were line-of-sight with the evaporation source (i.e., aligned to avoid shadowing); the film thickness was monitored with a quartz crystal microbalance. The resulting pyramids tend to have smoother facets and are more solid when the material is deposited relatively quickly (e.g., ~0.4-0.5 nm/s) and at pressures less than about $5\times10^{-6}$ Torr. Finally, to remove (60) the mask, the Cr-film was etched with a commercial etchant (Transene Corp., Danvers, Mass.) to reveal Ni pyramids (50 nm thick and ~250 nm across their base) situated within the centers of the silicon pyramidal pits (FIG. 2D).

Figure 3A:
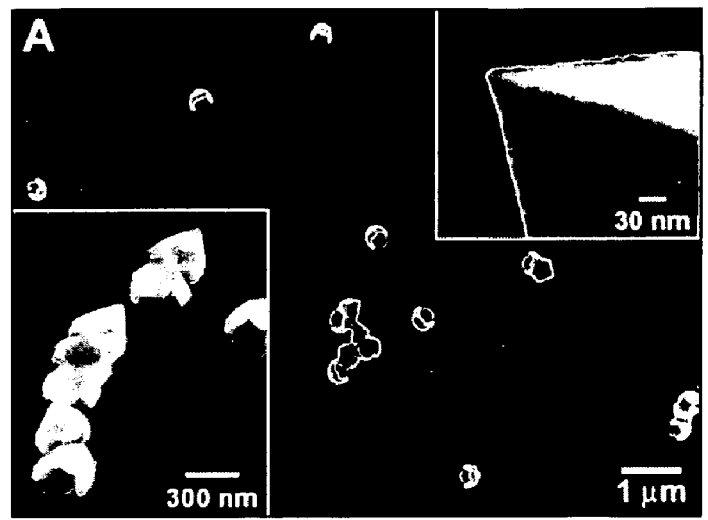
FIGS. 3A-C. FESEM images of metallic pyramids of a single material after removal of the silicon template. (A) 50-nm thick Ni pyramids. (right inset) Zoom-in of a tip with radius of curvature r<10 nm; (left inset) magnetized Ni pyramids that assembled into a chain. (B) 150-nm thick Ni pyramids. (right inset) Zoom-in of a tip with r<10 nm. (left inset) Arrow-like particle with smooth facets because of the Si (111) planes of the etched pits and with notches along the shaft that reproduce the edge-roughness of the Cr-mask. (C) 50-nm thick Au pyramids. Inset shows a Au tip with r<8 nm.

In order to release (70) the Ni-pyramids from the silicon template, this pattern was etched with KOH/IPA (FIG. 3A). A patterned area (pyramids spaced 2 µm×2 µm over 1 in.$^2$) in some embodiments generated ~$10^8$ pyramids/in.$^2$. These mesoscale pyramids can be isolated using a ~1 T SmFeB magnet or centrifugation (3000 rpm for 5 minutes). Since Ni is a hard magnetic material, the 50-nm thick pyramids isolated by the strong magnet tended to clump together or to align into chains (FIG. 3A, left inset). Chains formed when the Ni-pyramids were magnetized in the silicon mold; after release, their remnant magnetization assisted in their alignment. Importantly, a majority of the pyramidal tips we observed had a radius of curvature r<10 nm (FIG. 3A, right inset). The facets of the Ni-pyramids are remarkably smooth. Without limitation as to any one theory or mode of operation, it is believed that the exposed, crystalline Si(111) planes of the pyramidal pits can assist in molding and merging the nickel grains as they are deposited onto the surface.

Figure 3B:
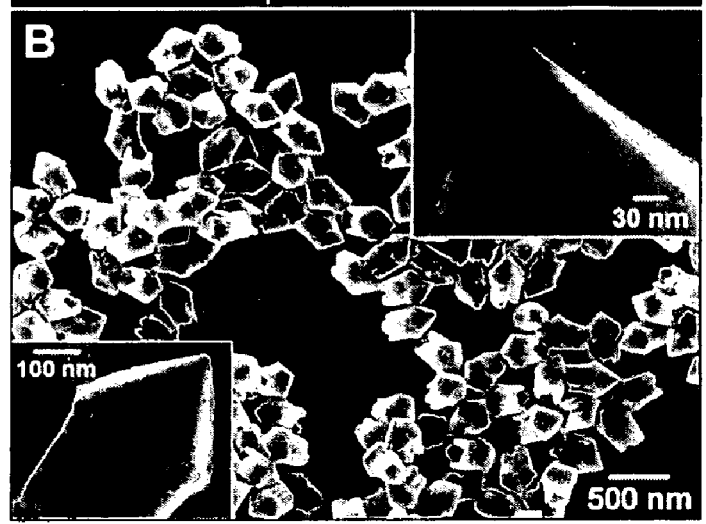
Figure 3C:
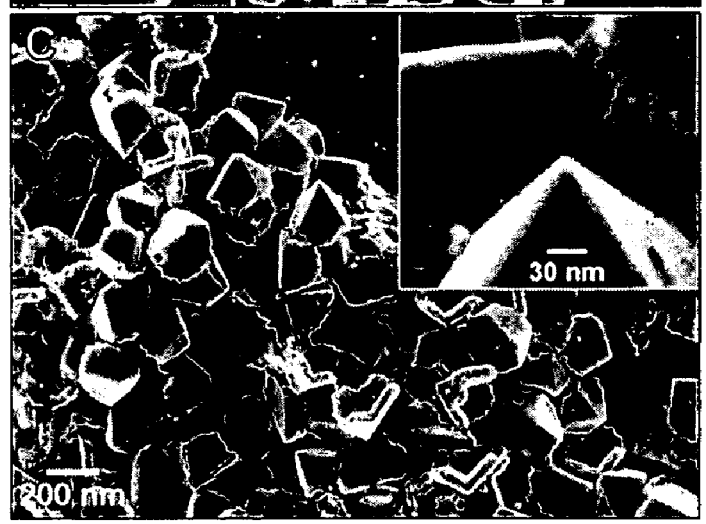

A similar technique was also used to fabricate pyramids with much thicker side-walls; 150 nm of nickel was deposited through the Cr-mask of holes (FIG. 3B). Certain distinct features of these arrow-like particles suggest a possible mechanism of the pyramid formation: (i) the ridges or notches along the shaft of the arrow reproduce exactly the granular structure of the Cr-deposition mask (FIG. 3B, left inset); (ii) the diameter of the shaft becomes smaller along the length of the particle, which indicates that the Cr-holes are decreasing in size; and (iii) the interior of the shaft is grainy because the metal is no longer depositing directly against a smooth surface. Because of their unique shape, these types of three-dimensional particles would be difficult to fabricate by other nanofabrication routes. In addition to Ni-pyramids, 50-nm thick gold pyramids were also fabricated using such a method (FIG. 3C). The smoothness of the facets and the sharpness of the tips (observed tips with r<8 nm) make them ideal structures for studying the local electromagnetic field enhancement of noble metal tips.

Figure 4A:
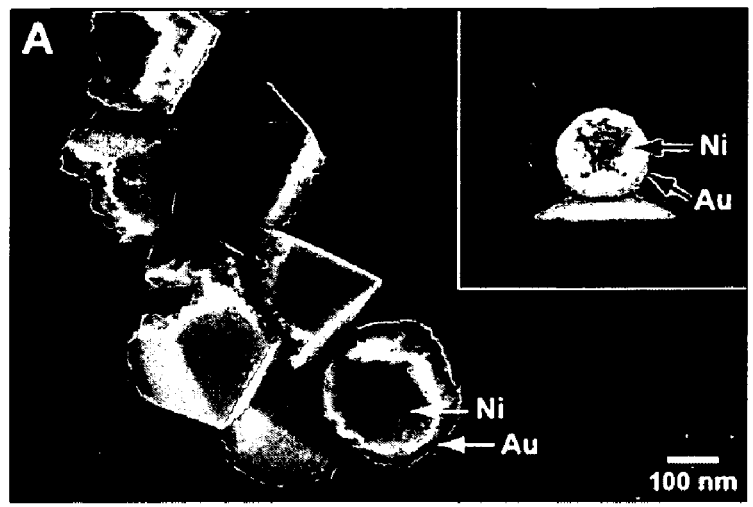
FIGS. 4A-C. FESEM images of pyramids composed of multiple layers. (A) Two-toned pyramids with a 25-nm Au outer shell and a 25-nm Ni inner shell. (inset) Au/Ni pyramid in an etched pit (tilt angle=15°). (B) Three-layer pyramids (Au/Ni/Au) of 10 nm Ni sandwiched between 25 nm of Au (25/10/25). (inset) Multi-layered structure in an etched pit (tilt angle=25°). (C) Au/Ni/Au pyramids with different layer thicknesses of materials: 20/50/20. Inset shows a tip from these structures with r<2 nm.
Figure 4B:
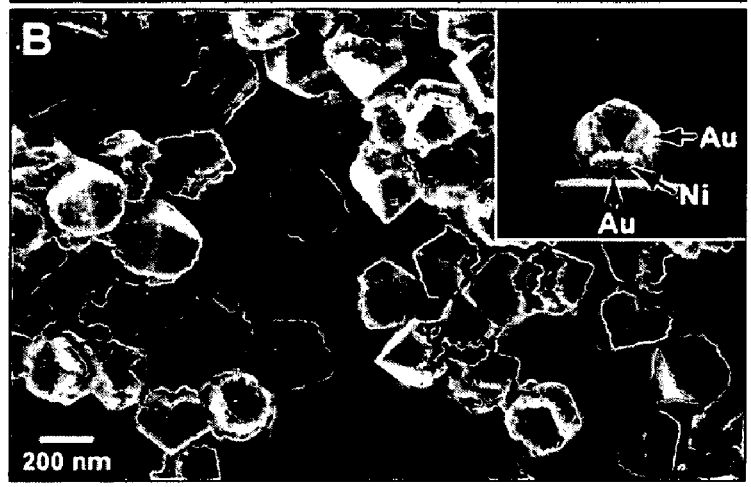
Figure 4C:
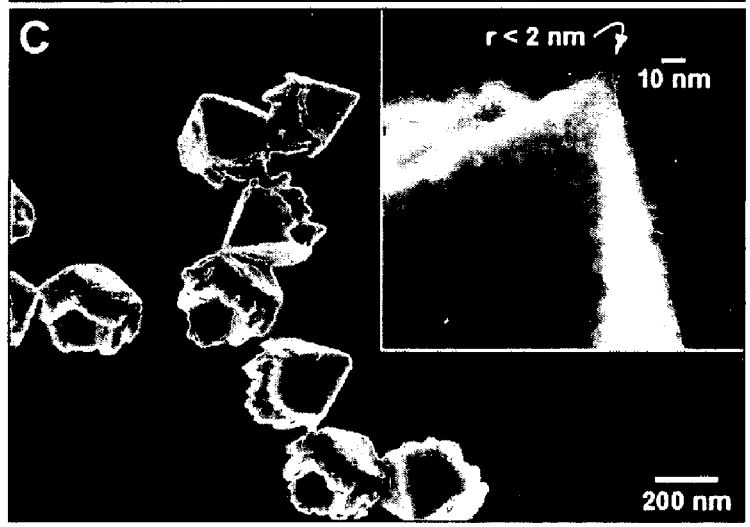

One possible advantage (besides creating nanoscale tips) of the present nanofabrication methodology is the ability to control both the materials and chemical functionality of the pyramids. A layer-by-layer feature of e-beam deposition was used to create multi-layered pyramids of gold and nickel with variable thicknesses. To create representative two-layered pyramids, 25 nm of Au and then 25 nm of Ni were evaporated through the same Cr-deposition mask (FIG. 4A). The inset image (tilted 15°) shows a Au/Ni pyramid before it was removed from the etched Si pit. Such mesostructures can be manipulated with magnetic fields because of their magnetic interior and can easily be chemically functionalized on their outer shell. Three-layer pyramids (Au/Ni/Au, similar to core-shell structures), that responded to a magnetic field and can have two different or orthogonal types of chemical functionality, were also prepared. FIG. 4B shows a 10-nm layer of Ni sandwiched between 25-nm layers of Au (25/10/25). The inset highlights the boundaries between the Ni and Au-layers. Tri-layer pyramids with different thicknesses of Au and Ni were also fabricated (FIG. 4C); remarkably, in these mesostructures, pyramidal tips exhibited radii of curvature r<2 nm (inset).

Figure 5:
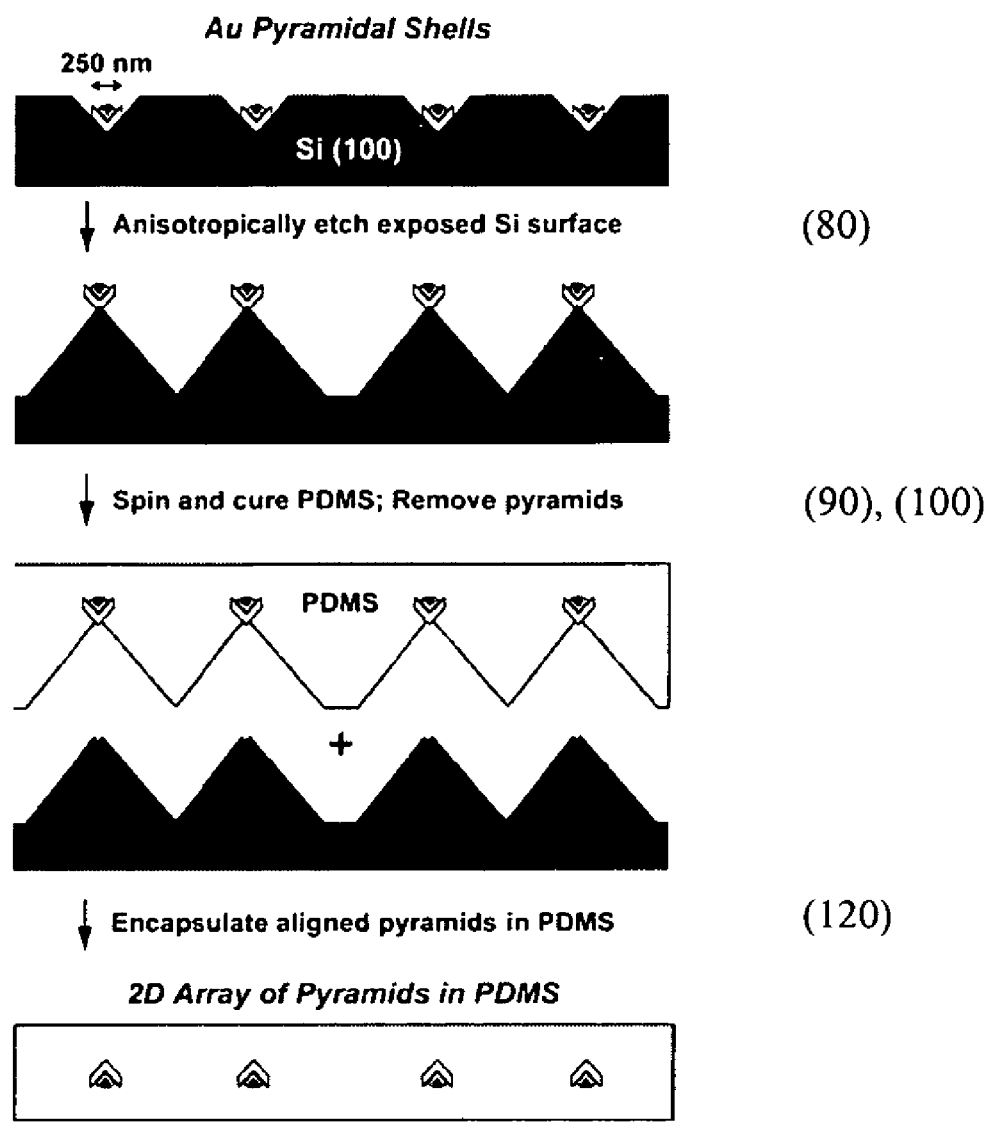
FIG. 5. Scheme depicting the transfer and encapsulation of Au pyramids in a PDMS film.

FIG. 5, with reference to FIG. 1, outlines a procedure for transferring Au pyramids situated within the etched pits of a Si(100) mold into a transparent PDMS film. As a departure from the method of FIG. 1, the Si substrate containing the Au pyramids (FIG. 6A) was treated (80), with an anisotropic Si etch solution. The pyramids acted as etch masks and protected the underlying silicon; the exposed Si(100) surface was etched quickly, leaving the Au pyramids supported on Si pedestals (FIG. 6B). To improve the adhesion between the pyramids and PDMS matrix, the Si substrate was first passivated with tridecafluoro-1,1,2,2-tetrahydrooctyl-1-trichlorosilane (Gelest, Inc.), and the Au pyramids were functionalized with (3-mercaptopropyl)trimethoxysilane (Aldrich). (See, e.g., W. R. Childs, R. G. Nuzzo, *Langmuir* 2005, 21, 195.) The sample was then contacted (90) with a representative dielectric material: pressed against a thin (10 µm) layer of unpolymerized h-PDMS and cured. (See, e.g., T. W. Odom, J. C. Love, D. B. Wolfe, K. E. Paul, G. M. Whitesides, *Langmuir* 2002, 18, 5314.) The h-PDMS film (with the Au pyramids now partially imbedded) was pulled (100) off the substrate with tweezers, with the pyramidal tips incorporated within and protruded partially from the PDMS mold (FIG. 6C, inset). The pyramids were shown transferred into PDMS by characterizing the etched Si substrate (FIG. 6D). To encapsulate (120) the Au pyramids fully, the array of pyramidal tips was exposed to the mercaptosilane and then spin-coated a thin (10 µm) layer of h-PDMS on top. FIG. 6E shows a digital display of a large-area PDMS film encapsulating an array of 250-nm Au pyramids.

Figure 7A:
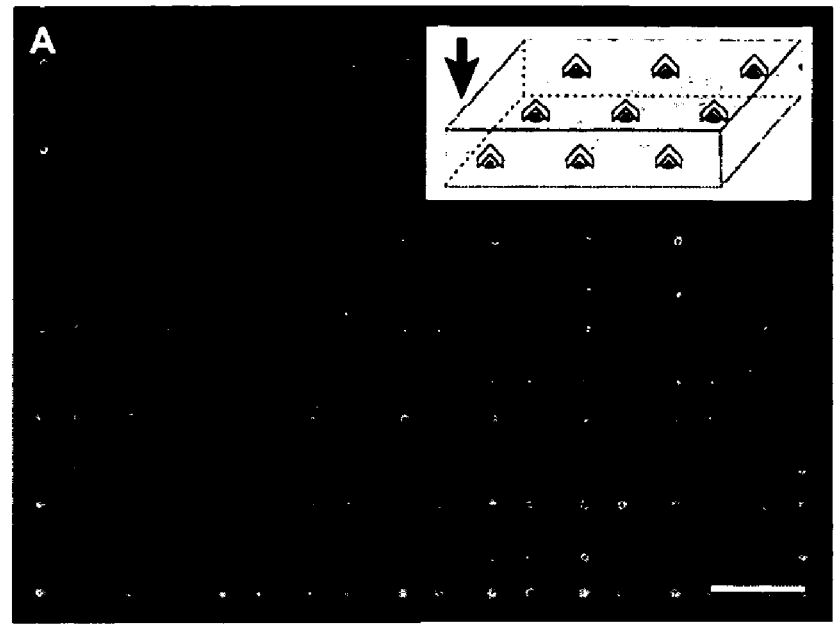
FIGS. 7A-B. Optical characterization of Au pyramids in an array whose plane is perpendicular to the optical axis of the microscope. (A) Dark field (DF) microscope image of encapsulated Au pyramids with tips pointing directly at the white light source. The black arrow in the inset image indicates the direction of the optical axis, and grey area denotes the plane of the particle array. Scale bar is 4 µm. (B) DF spectrum of the array of Au pyramids.
Figure 7B:
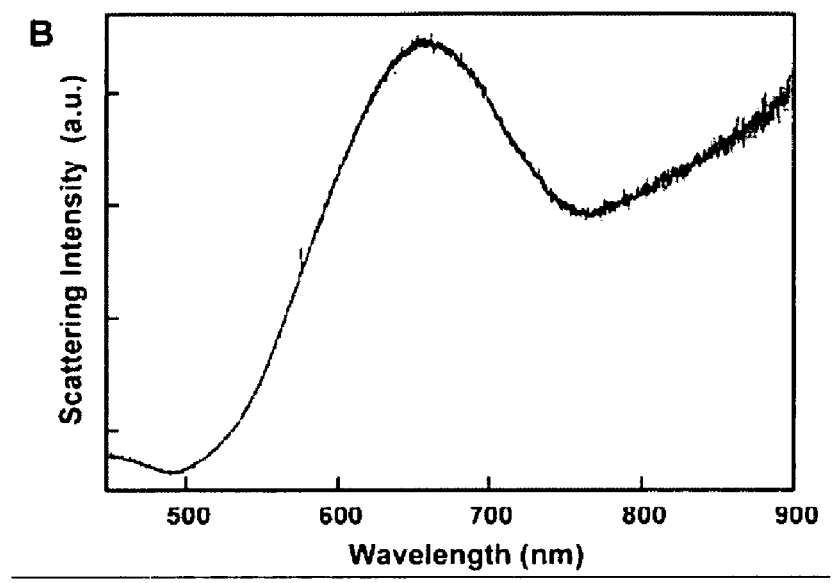

Dark field (DF) microscopy and spectroscopy were used to characterize the optical properties of the pyramidal particles. Excitation of the arrays was achieved by passing unpolarized or polarized white light through a dark-field condenser (NA=0.95). The scattered light from the pyramid array was collected using a 20× objective and then analyzed using a spectrometer coupled to a CCD camera. An array of nanoparticles whose plane was perpendicular to the optical axis of the microscope, and whose tips pointed toward the incident light (FIG. 3A, inset) was first characterized. FIG. 7A depicts a DF microscopic image of an array of red spots that correspond to an array of Au pyramidal particles. Note that because the monodispersity of the pyramids exceeds 95%, the spot sizes of the scattered light are uniform, and the color (red) of every spot is the same. The scattered spectrum obtained with unpolarized white light exhibited a strong peak at red wavelengths (650 nm) and another that appeared to extend into the near-infrared region (FIG. 7B). The optical response of this array did not change, however, when the incident light was polarized because the pyramidal particles in this orientation are symmetric with respect to the optical axis. Also, the scattering spectrum from the same array with tips pointing away from the light source (the film was flipped over) was identical to the spectra in FIG. 7B.

To investigate different orientations of the pyramidal array, using the flexible and soft nature of PDMS, the PDMS film containing the Au pyramidal shells was sliced into thin (500 µm) sections. One of these cross-sections was placed on a glass substrate such that the plane of the nanoparticle array was parallel to the optical axis of the microscope, and where the tips were pointed perpendicular to this axis (FIG. 8A). In this orientation, the illumination wavevector is now in the plane of the pyramid base. The DF image of a thin cross-section of an array (with only the bottom layer of pyramids in the depth of focus) is shown in FIG. 8B. Unpolarized white light excitation (●) produced a scattering spectrum with broad features (FIG. 8C), unlike the situation in FIG. 7, where the plane of the nanoparticle array was perpendicular to the optical axis. Also, since the orientation of the particles was now not symmetric with respect to the incident light, the effects of polarization on their optical properties could be explored. As the polarization vector rotated from being parallel to the pyramid base (▲) to an angle perpendicular to the base (parallel to the tips, ◀), the color of the scattered light shifted from a deep-red to a light-red.

This effect was most clearly pronounced in the scattering spectrum: polarization parallel to the base produced a resonance peak around 750 nm, while polarization perpendicular to the base did not (FIG. 8C). What is interesting is that the spectrum of the former case (polarization parallel to base) is different from the spectrum in FIG. 7C—even though they appear at first glance to be optically equivalent. In both cases the polarization vector was parallel to the pyramid base, although the propagation wavevector was from perpendicular directions.

As discussed above, this invention can provide a simple procedure for fabricating free-standing, or an array of mesoscale metallic pyramids with nanoscale tips. Certain embodiments can produce ~$10^9$ pyramids/in.$^2$ (e.g., limited only by the size of a h-PDMS mask), and hence the density of mesostructures can easily be scaled-up. Other release methods (e.g. mechanical pressure or molding) and the deposition of materials at different rates and temperatures—other than as described herein but as would be known to those skilled in the art and made aware of this invention—can be used to enhance the available benefits and advantages. Because the overall size of these structures is at least in part determined by the diameters of the Cr-holes in the deposition mask, decreasing these diameters can result in sub-100 nm pyramids. In addition, the ability to generate multi-layered pyramids with different types of functionality (including insulating materials) can also be useful. The production of free-standing and isolated noble metal particles with well-defined, ultra-sharp tips now also enables detailed studies of their optical properties (e.g. localized surface plasmon resonance).

As demonstrated, the present invention also provides a technique to align and manipulate arrays of pyramidal nanoparticles within a uniform dielectric environment. With control of the orientation of the particles, it is possible to investigate their orientation-dependent optical properties, which were found to be sensitive to both the illumination wavevector and polarization vector. Most importantly, it is also possible to correlate the orientation and anisotropic shape of nanodimensioned particles with specific multipolar plasmon resonances. Such an understanding of these unusual properties of relatively large plasmonic particles, especially those with sharp tips and edges, can be used to enhance the capabilities of various plasmon-based applications.

Examples of the Invention

The following non-limiting examples and data illustrate various aspects and features relating to the methods and/or composites of the present invention, including the preparation of nanodimensioned pyramidal particulates and fabrication of corresponding composites comprising two-dimensional arrays of such particulates, as are available through the synthetic techniques described herein. In comparison with the prior art, the present methods and composites provide results and data which are surprising, unexpected and contrary thereto. While the utility of this invention is illustrated through the use of several substrates, masks, deposited materials and pyramidal particulates prepared therefrom, it will be understood by those skilled in the art that comparable results are obtainable with various other substrates, masks and deposited materials, as are commensurate with the scope of this invention.

Example 1

Fabrication of Arrays of Au Pyramidal Particles: With reference to examples 2-4, phase-shifting photolithography was used to generate arrays of 250-nm diameter posts in positive-tone photoresist (Shipley 1805) on Si(100) wafers. Cr (10 nm) was evaporated on the posts (Kurt J. Lesker, PVD-75 E-beam Evaporation System), and the resist was removed by sonicating the pattern in acetone to reveal round holes in the Cr film. Pyramidal pits were formed beneath the holes by etching the exposed Si with an anisotropic etchant (23 g KOH, 33 mL isopropyl alcohol, in 100 mL $H_2O$ at 72° C.). 50-nm of Au was evaporated on this pattern, and then the Cr film was removed using commercial etchant (Transene Corp., Danvers, Mass.) to reveal the Au pyramidal particles within the Si pits.

Example 2

Procedure for making a Phase-Shift Photolithography (PSP) dot mask: A master pattern used to generate a PSP dot mask can be fabricated by any method known in the art that satisfies two criteria: (1) the diameter of the patterned posts should be less than half the wavelength of the light exposure and (2) their height should be equal to the exposure wavelength. (See, e.g., U.S. Pat. No. 6,753,131, the entirety of which is incorporated herein by reference.) Here, the pattern is spincoated with a thin layer of commercially available hard PDMS (Gelest, Inc.: e.g., a mixture of 3.4 g VDT-731, 10 mg 2,4,6,8-tetramethyltetravinyl cyclotetrasiloxane, 8.2 mg of Pt-divinyltetramethylsiloxane, 1.0 g HMS-301) for 40 seconds at 1000 rpm and then placed in a vacuum dessicator for 2 minutes at 2 mTorr. This pattern is then cured at 70° C. for 2 minutes in an oven before being coated with a 1 millimeter thick layer of 184-PDMS (Dow Chemicals), and cured for an additional 1.5 hours. After the h-PDMS/184-PDMS composite PSP mask is removed from the pattern, it can be used in subsequent photolithography steps.

Example 3

Procedure for making arrays of photoresist dots (posts): A thin film of a photoresist is spincoated onto a Si (100) wafer such that its thickness is ~450 nm. The recess side of the PSP mask is brought into contact with the photoresist/Si wafer sample and then exposed to UV light for 6 seconds. After the mask is removed, the wafer sample is immersed in 351 developer (Rohm and Haas, Inc.) for 5 seconds, immediately rinsed with water, then dried under a stream of nitrogen. This procedure is optimized so that the photoresist dots are round and greater than 200 nm in height.

Example 4

Procedure for making pyramids: The array of photoresist dots is placed in an electron beam (e-beam) evaporator such that it is oriented line-of-sight to the material source. A 10-nm layer of chromium is deposited on the array, and the photoresist is removed by sonicating the pattern in acetone for 1 minute. The chromium film is thin so that the photoresist dots remove very cleanly, leaving behind an array of round holes in the chromium film on the Si(100) wafer. The sample is then put in an anisotropic Si etch (e.g., 23 g potassium hydroxide, 100 mL water, 33 mL isopropyl alcohol) at 72° C. for 3 minutes and immediately rinsed with water. This sample is now ready to act as the pyramid template in subsequent steps.

This pyramid template is placed in the e-beam evaporator, again line-of-sight, and an appropriate material (e.g., Au and/or Ni) is deposited on it. The Cr film is etched away using an available Cr etchant (Transene Corp.), and the hole film is removed to reveal the pyramids in Si pits.

Figure 9:
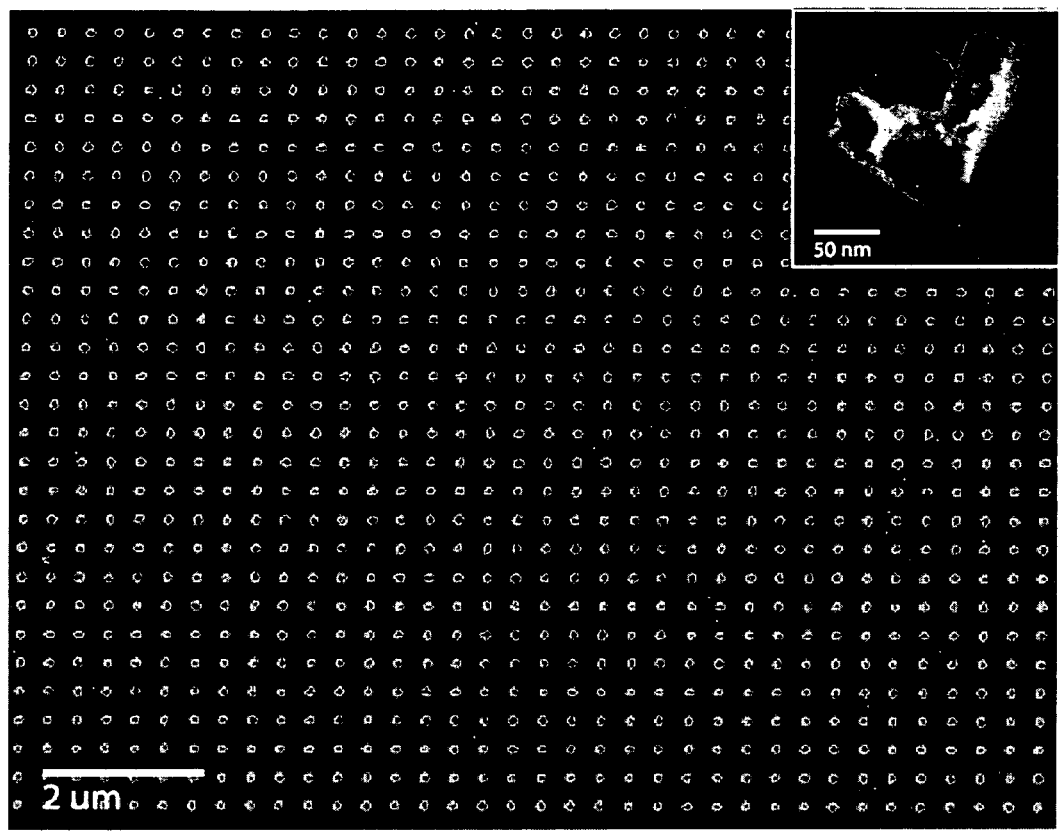
FIG. 9. An SEM image of a pattern of fabricated Au pyramids, at 4×10$^9$ particulates per square inch.

Such procedures can be used to prepare 100 nm basal-dimensioned Au pyramids spaced by 400 nm (center-to-center). Ability to increase pattern density permits generation of about $4\times10^9$ pyramid particulates per square inch of pattern. (See, FIG. 9.) Experiment and numerical calculations show such smaller pyramids are more robust than their larger counterparts and provide different light-scattering properties.

Example 5

Encapsulation of Au Pyramidal Particle Arrays in PDMS: Substrates with arrays of Au pyramids within Si pits were exposed to an anisotropic Si etch for about 2.5 minutes, such that Au pyramids could be supported on the resulting Si pedestals. Then, the Si was passivated with tridecafluoro-1,1,2,2-tetrahydrooctyl-1-trichlorosilane (Gelest, Inc.) for 90 min. The Au pyramids were functionalized by immersing the pattern in a 3 mM solution of (3-Mercaptopropyl)trimethoxysilane (MPTMS, Aldrich) for 30 sec and washing with de-ionized water and ethanol. This pattern was placed in a solution of mM HCl for 15 min and rinsed again with deionized water and ethanol. (W. R. Childs, R. G. Nuzzo, supra, 2005) Next, the pattern was pressed into a thin layer of unpolymerized h-PDMS (T. W. Odom, J. C. Love, D. B. Wolfe, K. E. Paul, G. M. Whitesides, supra, 2002) that was supported by a 0.5 mm-layer of Sylgard 184-PDMS. Before curing in an oven at 70° C. for 30 min, the sample was placed into a dessicator (10 min) to remove air bubbles. Removal of the Si pedestal substrate revealed Au pyramid arrays partially encapsulated in h-PDMS. The exposed Au tips were functionalized with MPTMS prior to encapsulation with h-PDMS.

Example 6

Manipulating the Orientation of the Au Pyramidal Nanoparticle Array: Arrays of pyramids whose tips were pointed toward the light source and whose plane was perpendicular to the optical axis of the microscope was achieved by simply placing the PDMS film flat on the sample stage beneath the condenser. Arrays of pyramids whose tips were pointed perpendicular to the light source and whose plane was parallel to the optical axis was achieved by slicing a thin cross-section (~500 µm) of the PDMS film/pyramid array and rotating it 90°. The scattering spectra for this orientation were taken only from the bottom layer of the array.

Example 7

Optical Characterization: Scattering spectra were collected with an inverted microscope (Eclipse TE-200, Nikon) using a standard transmission dark field (DF) setup. Collimated white light (Halogen) was passed through a DF condenser (NA=0.8-0.95) equipped with a rotatable polarizer so that the incident light could be polarized at certain angles with respect to the particle array. Some of the light passing through the condenser acquires a component perpendicular to the sample. Blocking this component did not affect the spectral response; therefore, omitting this step, it was assumed that most of the deflected light incident on the particle arrays maintained a polarization similar to the one as before the condenser. The light scattered from the sample was collected with a 20× objective (NA=0.75) and focused onto a Czerny-Turner spectrometer (Triax 552/LN-Cooled CCD, Horiba Jobin Yvon, Inc.). The scattering data was corrected by subtracting the PDMS background and then dividing by the spectrum of the white light source.

We claim:

1. A method of preparing a pyramidal particulate, said method comprising:
   providing a substrate and a mask thereon, said mask comprising at least one aperture therethrough;
   anisotropically treating said substrate through said aperture and under said mask to provide a pyramidal recess in said substrate, wherein said mask is undercut; and
   depositing a layer of a first material component through said undercut mask and on said pyramidal recess surface to provide said pyramidal particulate with a smaller configuration than said pyramidal recess.

2. The method of claim 1 further comprising removing said pyramidal particulate from said substrate.

3. The method of claim 1 depositing at least one of a second material layer and a third material layer on said first material layer, in said recess.

4. The method of claim 1 wherein said aperture has a diameter dimension ranging from about 100 nm to about 250 nm.

5. The method of claim 1 wherein said mask comprises a substantially two-dimensional array of apertures, and at least said first material layer is deposited in an array of pyramidal recesses in said substrate.

6. The method of claim 5 removing said mask and releasing said pyramidal particulate.

7. The method of claim 5 wherein said substrate is anisotropically treated under said mask.

8. The method of claim 7 positioning said two-dimensional array of said material components at least partially within a dielectric material.

9. The method of claim 8 using said two-dimensional array to characterize optical properties of said pyramidal material components.

10. The method of claim 9 comprising at least one of microscopic and spectroscopic analyses of said pyramidal components, said two-dimensional array oriented about an axis of irradiation, said irradiation polarizable and wavelength variable.

11. The method of claim 10 correlating orientation of said pyramidal material components with at least one of illumination wave vector and polarization vector.

12. The method of claim 1 wherein said layer of said first material component on said pyramidal recess surface is deposited by physical vapor deposition.

13. The method of claim 12 wherein said physical vapor deposition is electron beam physical vapor deposition.

* * * * *

UNITED STATES PATENT AND TRADEMARK OFFICE
CERTIFICATE OF CORRECTION

PATENT NO. : 8,048,789 B2  Page 1 of 1
APPLICATION NO. : 11/411594
DATED : November 1, 2011
INVENTOR(S) : Teri W. Odom, Joel Henzie and Eun-Soo Kwak It is certified that error appears in the above-identified patent and that said Letters Patent is hereby corrected as shown below:

Column 1, Lines 7-10:
"The United States government has certain rights to this invention pursuant to Grant No. NCC2-1363 from the National Aeronautics and Space Administration to Northwestern University." should read --This invention was made with government support under NCC-2-1363 awarded by National Aeronautics and Space Administration. The government has certain rights in the invention.--

Column 11, Line 52:
"1,2,2-tetrahydrooctyl-1-trichlorosilane (Gelest, Inc.) for 90" should read --1,2,2-tetrahydrooctyl-1-trichlorosilane (Gelest, Inc.) for ~90--.

Signed and Sealed this
Seventh Day of February, 2012

David J. Kappos
*Director of the United States Patent and Trademark Office*